US010733340B2

(12) United States Patent
Saihara

(10) Patent No.: US 10,733,340 B2
(45) Date of Patent: Aug. 4, 2020

(54) SYSTEM CONFIGURATION CREATION SUPPORTING DEVICE

(71) Applicant: Mitsubishi Electric Corporation, Tokyo (JP)

(72) Inventor: Takafumi Saihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/328,282

(22) PCT Filed: Mar. 10, 2017

(86) PCT No.: PCT/JP2017/009781
§ 371 (c)(1),
(2) Date: Feb. 26, 2019

(87) PCT Pub. No.: WO2018/163421
PCT Pub. Date: Sep. 13, 2018

(65) Prior Publication Data
US 2019/0362047 A1 Nov. 28, 2019

(51) Int. Cl.
G06F 17/50 (2006.01)
G06F 30/30 (2020.01)
G06F 3/14 (2006.01)

(52) U.S. Cl.
CPC ............ *G06F 30/30* (2020.01); *G06F 3/14* (2013.01)

(58) Field of Classification Search
CPC ............ G06F 30/30; G06F 3/14; G06F 30/00
USPC ................................. 716/100–105
See application file for complete search history.

(56) References Cited

U.S. PATENT DOCUMENTS

| 5,829,003 A | 10/1998 | Okura |
| 2004/0073659 A1 | 4/2004 | Rajsic et al. |
| 2005/0152289 A1* | 7/2005 | Nagata .................. H04L 12/462 370/256 |
| 2007/0220451 A1* | 9/2007 | Arnone .................. H04L 41/12 716/100 |

(Continued)

FOREIGN PATENT DOCUMENTS

| CN | 1531252 A | 9/2004 |
| DE | 102006059829 A1 | 6/2008 |

(Continued)

OTHER PUBLICATIONS

International Search Report dated Jun. 6, 2017 for PCT/JP2017/009781 filed on Mar. 10, 2017, 9 pages including English Translation.

(Continued)

Primary Examiner — Nghia M Doan
(74) Attorney, Agent, or Firm — Xsensus LLP

(57) ABSTRACT

A system configuration creation supporting device includes: a display unit to display a network configuration diagram in which a first object and a second object within a first network level of a plurality of network levels are arranged, the first object being an image representing a network, the second object being an image representing a node connected to the network; and a data processing unit to calculate, on the basis of the first network level, coordinates for displaying the first and second objects on the display unit, and display on the display unit the network configuration diagram according to the first network level on the basis of the calculated coordinates.

13 Claims, 10 Drawing Sheets

(56) References Cited

U.S. PATENT DOCUMENTS

| | | | |
|---|---|---|---|
| 2008/0092131 A1* | 4/2008 | McIntyre | G06F 9/451 |
| | | | 717/172 |
| 2008/0189637 A1* | 8/2008 | Krajewski | G06F 8/36 |
| | | | 715/771 |
| 2013/0205270 A1 | 8/2013 | Yoshimura et al. | |

FOREIGN PATENT DOCUMENTS

| | | | |
|---|---|---|---|
| JP | 05-143588 A | 6/1993 | |
| JP | 08-315038 A | 11/1996 | |
| JP | 11-213007 A | 8/1999 | |
| JP | 2008-004087 A | 1/2008 | |
| JP | 2008-293080 A | 12/2008 | |
| JP | 2013-161370 A | 8/2013 | |
| JP | 2016-004562 A | 1/2016 | |

OTHER PUBLICATIONS

Notification of Reasons for Refusal received for Japanese Patent Application No. 2018-511774, dated May 25, 2018, 7 pages including English Translation.

Decision to Grant a Patent received for Japanese Patent Application No. 2018-511774, dated Sep. 26, 2018, 6 pages including English Translation.

German Office Action dated Apr. 17, 2019, issued in corresponding German Patent Application No. 112017004175.9, (with English translation) 13 pages.

Chinese Office Action dated Dec. 6, 2019 in Chinese Application No. 201780063865.4.

Chinese Office Action dated May 22, 2020 in Chinese Application No. 201780063865.4.

\* cited by examiner

SYSTEM CONFIGURATION CREATION SUPPORTING DEVICE

CROSS-REFERENCE TO RELATED APPLICATIONS

The present application is based on PCT filing PCT/JP2017/009781, filed Mar. 10, 2017, the entire contents of which are incorporated herein by reference.

FIELD

The present invention relates to a system configuration creation supporting device that supports creation of a network system configuration.

BACKGROUND

In recent years, engineering environment in factory automation (FA) tends to become more complex as well as becoming large in scale. In particular, due to increased use of network systems that connect FA devices such as programmable logic controllers (PLCs) and human machine interfaces (HMIs) to one another via networks for sharing and managing information, the engineering environment facilitating the design of the network systems is desired.

A development supporting device described in Patent Literature 1 displays a configuration of a network system in an easy-to-understand manner by using diagrams so that the configuration of the network system can be easily recognized. In addition, the development supporting device described in Patent Literature 1 builds a database of a network configuration using numbers identifying networks, and displays a network system diagram by using the database.

CITATION LIST

Patent Literature

Patent Literature 1: Japanese Patent Application Laid-open No. 2008-4087

SUMMARY

Technical Problem

Unfortunately, patent Literature 1, which provides the technology of the related art, does not define structures at upper and lower levels of the numbers identifying networks. For the technology of patent Literature 1, thus, it is difficult to distinguish between network levels. Thus, when a network system including a plurality of network levels is created, it is in some cases difficult for a user of the network system to recognize an overview of the network configuration.

The present invention has been made in view of the above, and an object thereof is to provide a system configuration creation supporting device capable of easily creating a configuration of a network system including a plurality of network levels.

Solution to Problem

To solve the aforementioned problems and achieve the object, the present invention provides a system configuration creation supporting device. The system configuration creation supporting device includes a display unit to display a network configuration diagram in which a first object and a second object within a first network level of a plurality of network levels are arranged, the first object being an image representing a network, the second object being an image representing a node connected to the network. The device further includes a data processing unit to calculate, on the basis of the first network level, coordinates for displaying the first and second objects on the display unit, and display on the display unit the network configuration diagram according to the first network level on the basis of the calculated coordinates.

Advantageous Effects of Invention

A system configuration creation supporting device according to the present invention produces an effect of facilitating creation of a configuration of a network system including a plurality of network levels.

DESCRIPTION OF EMBODIMENT

A system configuration creation supporting device according to an embodiment of the present invention will be described in detail below with reference to the drawings. Note that the present invention is not limited to the embodiment.

Embodiment

Figure 1:
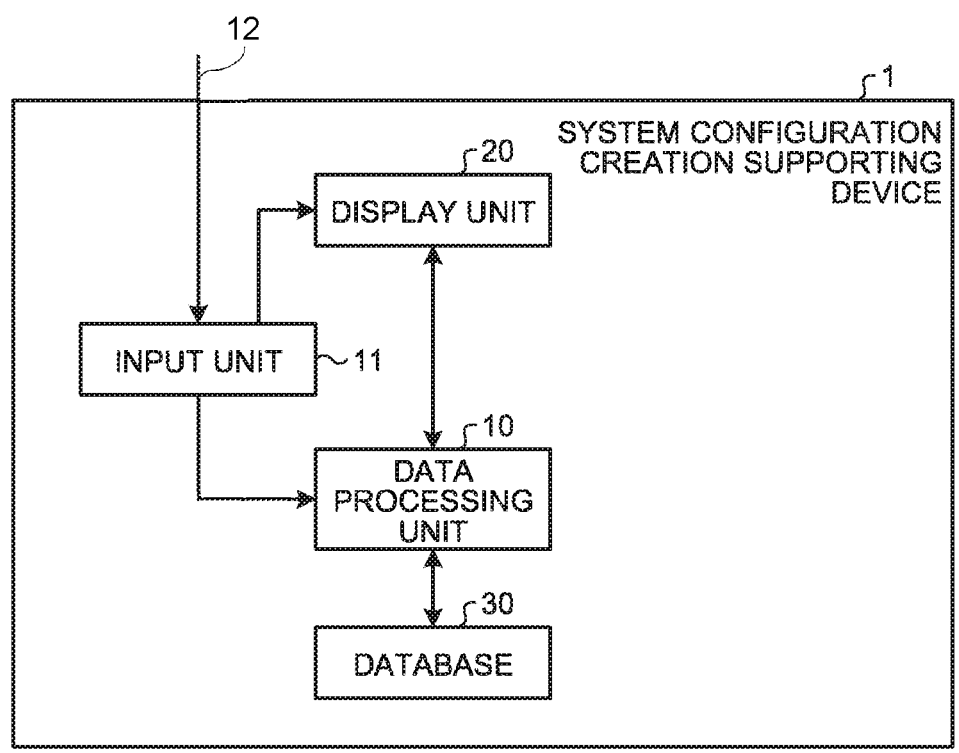
FIG. 1 is a diagram illustrating a schematic configuration of a system configuration creation supporting device according to an embodiment of the present invention.

FIG. 1 is a diagram illustrating a schematic configuration of a system configuration creation supporting device according to an embodiment of the present invention. Note that, in the embodiment, the highest network level in a network hierarchy is defined as level "1", and the level number increases, for example, to level "2" and then to level "3" as the network level becomes lower. In other words, level "N", which is the level number in the network hierarchy, where N is a natural number, sequentially increases one by one from level "1", which is the highest network level in the network hierarchy, as the network level becomes lower. In addition, in the embodiment, the configuration of a network system may be referred to as a network configuration. In addition, in the embodiment, the network hierarchy may be referred to as a hierarchy.

The system configuration creation supporting device 1 of the embodiment is a computer that supports creation of a network configuration. The system configuration creation supporting device 1 is applied to building and verification of industrial systems using networks.

The system configuration creation supporting device 1 includes a data processing unit 10 that performs a process for managing a network configuration and a process for displaying the network configuration, and an input unit 11 that receives information 12 transmitted from outside and inputs the received information 12 to the data processing unit 10. The system configuration creation supporting device 1 also includes a display unit 20 that displays the network configuration, and a database 30 that stores information on the network configuration. In the system configuration creation supporting device 1, the data processing unit 10 is connected to the input unit 11, the display unit 20, and the database 30.

The system configuration creation supporting device 1 of the embodiment causes the display unit 20 to display each level of the network configuration that is the configuration of a network system, so as to support building of the network system. In a case where a network included in the network system has a plurality of levels, the system configuration creation supporting device 1 manages each of the levels of the network. The system configuration creation supporting device 1 displays each of the levels of the network configuration by a function of organizing the network configuration, and receives an editing process that is a process performed by a user for modifying the network configuration.

The system configuration creation supporting device 1 arranges, on the screen of the display unit 20, objects that are images each representing a network, a controller, or a control screen. A network and a controller are components of a network system that is to be created. One example of a controller is a PLC. Devices connected to a network may be dedicated devices for the network, or may be general-purpose devices.

The system configuration creation supporting device 1 gives each of the objects network level information indicating which level in a network configuration a network belongs to, which will be described later. In addition, on the basis of the network level information, the system configuration creation supporting device 1 displays networks in a network system that are arranged in a decreasing order of level from the highest level. Furthermore, when a process for modifying a network system is performed, the system configuration creation supporting device 1 rearranges networks in the network system from the highest level on the basis of the network level information, and displays again the rearranged network.

The system configuration creation supporting device 1 also has a highlighting function of causing the display unit 20 to highlight each level of a network configuration. An example of the highlighting function is a function of displaying each of organized network levels in the corresponding one of color-coded regions. In a case where a network configuration is modified by a user, the system configuration creation supporting device 1 causes the display unit 20 to highlight each level of the modified network configuration.

In addition, the system configuration creation supporting device 1 organizes a network configuration by using a network configuration organizing function, which will be described later. Specifically, the system configuration creation supporting device 1 calculates coordinates on a screen on which each object is to be placed on the basis of the network level to which the object belongs. On the basis of the calculated coordinates, the system configuration creation supporting device 1 arranges the objects on a level-by-level basis on the screen.

Information which the input unit 11 receives from outside is an instruction 12 from a user for modifying information displayed by the display unit 20. A process for modifying information displayed by the display unit 20 includes a process for adding or a process for deleting information. The input unit 11 receives from a user an instruction 12 to display a network configuration diagram, which is a configuration diagram of a network system, an instruction to modify a network configuration diagram, an instruction to perform the network configuration organizing function, or an instruction to perform the highlighting function.

The data processing unit 10 is connected to the display unit 20 and performs data processing on the basis of an instruction 12 received by the input unit 11. Specifically, the data processing unit 10 reads various pieces of information from the database 30 and displays the read information on the display unit 20. In addition, when information displayed by the display unit 20 is modified by an operation performed by a user, the data processing unit 10 reflects the modification in the database 30. In other words, when information is modified on the display unit 20, the data processing unit 10 modifies information in the database 30 so as to provide information corresponding to the modification on the display unit 20.

When a user designs a network configuration, the display unit 20 displays, on the display screen, a network configuration diagram, which is a configuration diagram of a network system. The database 30 stores an object list 91 and property information 70 and 80, all of which will be described later. The object list 91 is a list of objects, and the property information 70 and 80 is properties of the objects. The object list 91, and the property information 70 and 80 are information that is created on the basis of an instruction from a user, and corresponds to a network configuration. The object list 91 and the property information 70 and 80 of the objects, which are stored in the database 30, are used for data processing by the data processing unit 10.

Figure 2:
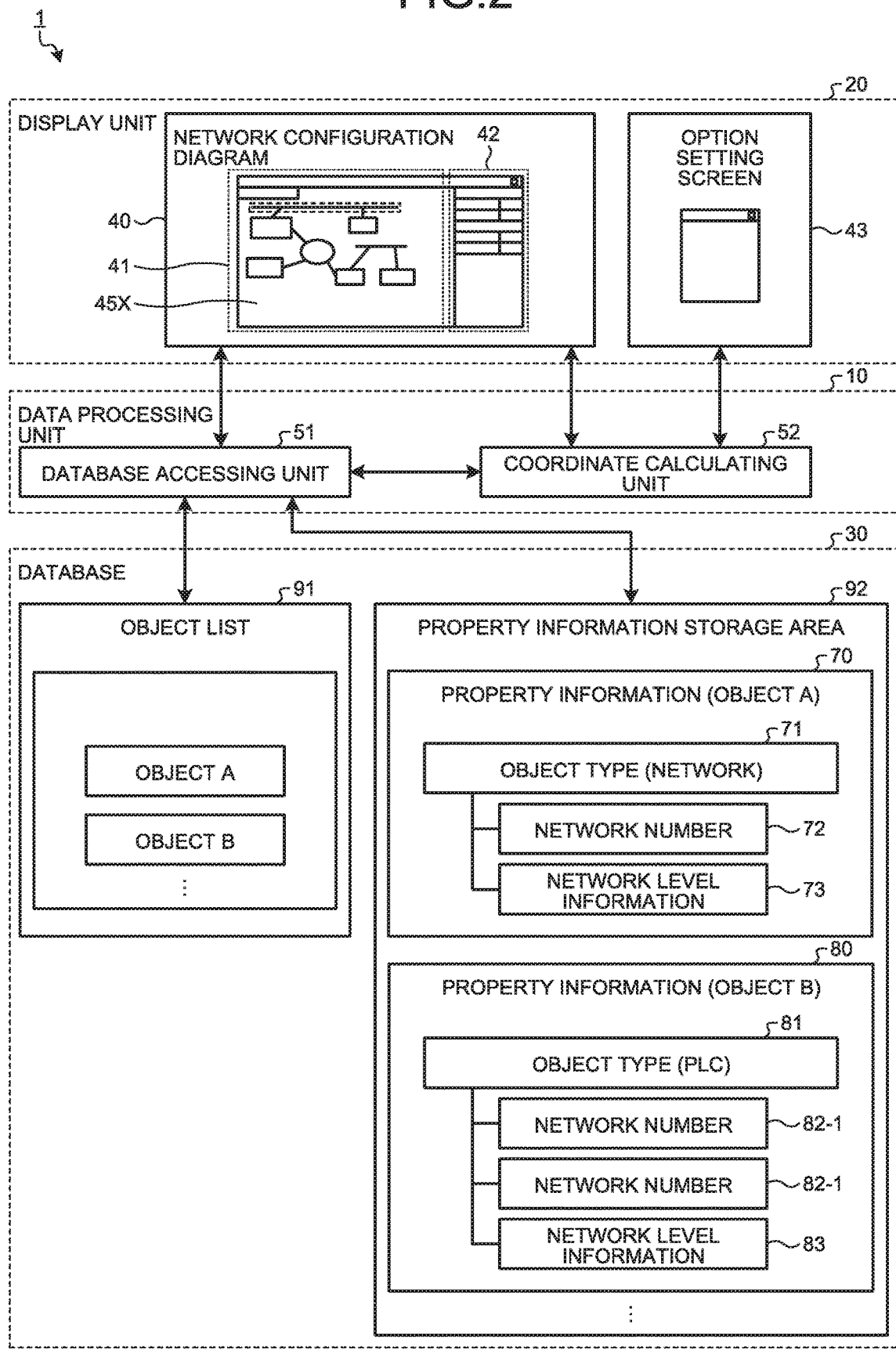
FIG. 2 is a diagram illustrating a detailed configuration of the system configuration creation supporting device according to the embodiment.

FIG. 2 is a diagram illustrating a detailed configuration of the system configuration creation supporting device according to the embodiment. Note that FIG. 2 illustrates the data processing unit 10 of the system configuration creation supporting device 1 with the input unit 11 omitted.

One example of the display unit 20 is a liquid crystal display monitor. In accordance with instructions sent from the data processing unit 10, the display unit 20 displays various pieces of information on a screen that is a rendering region. A screen displayed on the display unit 20 includes a structure display region 40 and an option setting display region 43. The structure display region 40 displays a configuration of a network system and property information of objects. The option setting display region 43 displays an option setting screen for display functions. The structure display region 40 defines a first region of the screen displayed by the display unit 20, and the option setting display region 43 defines a second region of the screen displayed by the display unit 20.

The structure display region 40 includes a configuration diagram display region 41 in which objects can be arranged at any given locations on the screen, and a property display region 42 in which the property information 70 and 80 is displayed. The configuration diagram display region 41 as a region displaying a network configuration diagram 45X, and the property display region 42 is a region displaying the property information 70 and 80 of objects selected on the network configuration diagram 45X. In addition, the option setting display region 43 is a region in which option setting for screen display is displayed.

The network configuration diagram 45X is a diagram illustrating a configuration of a network system. The network configuration diagram 45X includes information on the locations of placement of the individual objects, connections of the objects, and object names.

In the property display region 12, a list of the property information 70 and 80 of objects selected by the user on the network configuration diagram 45X is displayed in the form of a table. Alternatively, the property information 70 and 80 of the objects may be displayed in the property display region 42 in the form other than a table.

In the option setting display region 43, set items and set/unset states of the network configuration organizing function or the highlighting function are displayed. The network configuration organizing function and the highlighting function are optional functions of screen display that are set in accordance with instructions that the input unit 11 receives from a user.

The network configuration organizing function is a function of arranging or rearranging objects on the network configuration diagram 45X on the basis of the property information 70 and 80 of the objects. The network configuration organizing function may also include a function of switching the direction of display of the levels to which networks in the network configuration diagram 45X belong, to the vertical direction or the horizontal direction of the screen.

When the direction of display of the levels is set to the vertical direction of the screen, the display unit 20 displays a network of a higher level at an upper location on the screen and a network of a lower level at a lower location on the screen. When the direction of display of the levels is set to the horizontal direction of the screen, the display unit 20 displays a network of a higher level at a left location on the screen and a network of a lower level at a right location on the screen. Alternatively, the display unit 20 may display a network of a higher level at a right location on the screen and a network of a lower level at a left location on the screen.

The data processing unit 10 includes a database accessing unit 51 that accesses the database 30, and a coordinate calculating unit 52 that displays the network configuration diagram 45X on the display unit 20. The database accessing unit 51 stores information modified on the display unit 20 in the database 30. Specifically, the database accessing unit 51 stores, in the database 30, the property information 70 and 80 modified on the display unit 20 and objects modified on the display unit 20. In addition, the database accessing unit 51 accesses the database 30 and reads information in the database 30. The database accessing unit 51 sends, to the coordinate calculating unit 52, information read from the database 30, and receives information sent from the coordinate calculating unit 52. In addition, upon receiving an instruction to read information from the coordinate calculating unit 52, the database accessing unit 51 reads from the database 30 the information specified by the reading instruction and sends the read information to the coordinate calculating unit 52.

The coordinate calculating unit 52 calculates coordinates of individual objects in the network configuration diagram 45X on the basis of the property information 70 and 80 read by the database accessing unit 51, and arranges or rearranges the objects on the display unit 20. On the basis of the property information 70 and 80 of the individual objects, thus, the coordinate calculating unit 52 displays objects by network level on the display unit 20, the objects representing components of the network system.

In addition, the coordinate calculating unit 52 switches the direction of display of the network levels to the vertical direction or the horizontal direction of the screen on the display unit 20 in accordance with instruction information input by a user. When using the network configuration organizing function, the coordinate calculating unit 52 calculates coordinates of the location at which a network of the highest network level is to be placed, and extracts objects of nodes included in the same network level as the network of the highest network level. The coordinate calculating unit 52 then calculates coordinates of vertices of a rectangular region in which the network and the extracted objects are included. The rectangular region in which the objects are included is a rectangular region of the screen in which region the objects are displayed. In addition, when performing the highlighting function, the coordinate calculating unit 52 highlights objects by network level on the display unit 20.

The database 30 stores the object list 91 and a property information storage area 92. The object list 91 is a list of objects included in the network configuration diagram 45X. The objects registered in the object list 91 are objects that are to be used by the system configuration creation supporting device 1. In a case where a plurality of network configuration diagrams 45X are used, the object list 91 registers a list of objects for each of the network configuration diagrams 45X. FIG. 2 illustrates a case where the network configuration diagram 45X includes objects A and B and the objects A and B are registered in the object list 91. All the objects included in the network configuration diagram 45X are stored in the object list 91.

The object list 91 and the property information storage area 92 have object identification information for uniquely identifying the objects, and cooperate with each other using the object identification information serving as keys.

The property information storage area 92 is an area in which the property information 70 of the object A and the property information 80 of the object B are stored.

The property information 70 and 80 is a group of pieces of information used for identifying the objects.

In this embodiment, the object A is described as being an object representing a network and the object B is described as being an object representing a PLC. The property information 70 of the object A includes an object type 71, a network number 72, and network level information 73. The network number 72 is identification information for identifying the network. The network level information 73 indicates the position of the level of the network. Since the object A is an object representing a network, information indicating a network is stored in the object type 71.

The property information 80 of the object B includes an object type 81, network numbers 82-1 and 82-2, and network level information 83. The network numbers 82-1 and 82-2 are pieces of identification information for identifying networks. The network level information 83 indicates the position of the level of the network. Since the object B is an object representing a PLC, information indicating a PLC is stored in the object type 81.

The network number 72 is a number for identifying the object A indicating the network on the network configuration diagram 45X. The network numbers 82-1 and 82-2 are numbers for identifying objects indicating networks to which the object B is connected on the network configuration diagram 45X. For the object B that is an object other than a network, the network numbers 82-1 and 82-2 of all objects indicating networks to which the object B is connected are stored in the property information 80. The property information 80 includes two network numbers 82-1 and 82-2; thus, it is found that the object B is connected to two networks.

Note that the property information 70 and 80 may include an object name that is the name of an object or a network type that represents the type of a network. A user may freely set an object name of each of objects arranged on the network configuration diagram 45X. The network type is information enabling identification of the type of a network in the network configuration diagram 45X.

When the input unit 11 has received from a user an instruction to place a new object on the network configuration diagram 45K of the display unit 20, the coordinate calculating unit 52 generates new property information on the network placed on the network configuration diagram 45K and displays on the display unit 20 the generated property information. At this point, the coordinate calculating unit 52 sets a default value of network level information to the new property information. The database accessing unit 51 then stores, in the database 30, the newly placed object and the generate property information.

In addition, in accordance with an instruction from the coordinate calculating unit 52, the display unit 20 displays the network configuration diagram 45K and an input screen for the user to set new network level information. This allows the user to set new network level information, on the display unit 20 via the input unit 11.

When the input unit 11 has received from a user an instruction to modify the network level information 73 and 83 from the property display region 42 of the display unit 20, the display unit 20 informs the database accessing unit 51 of the modification of the network level information 73 and 83. The database accessing unit 51 thus registers the modified network level information 73 and 83 in the database 30.

Figure 3:
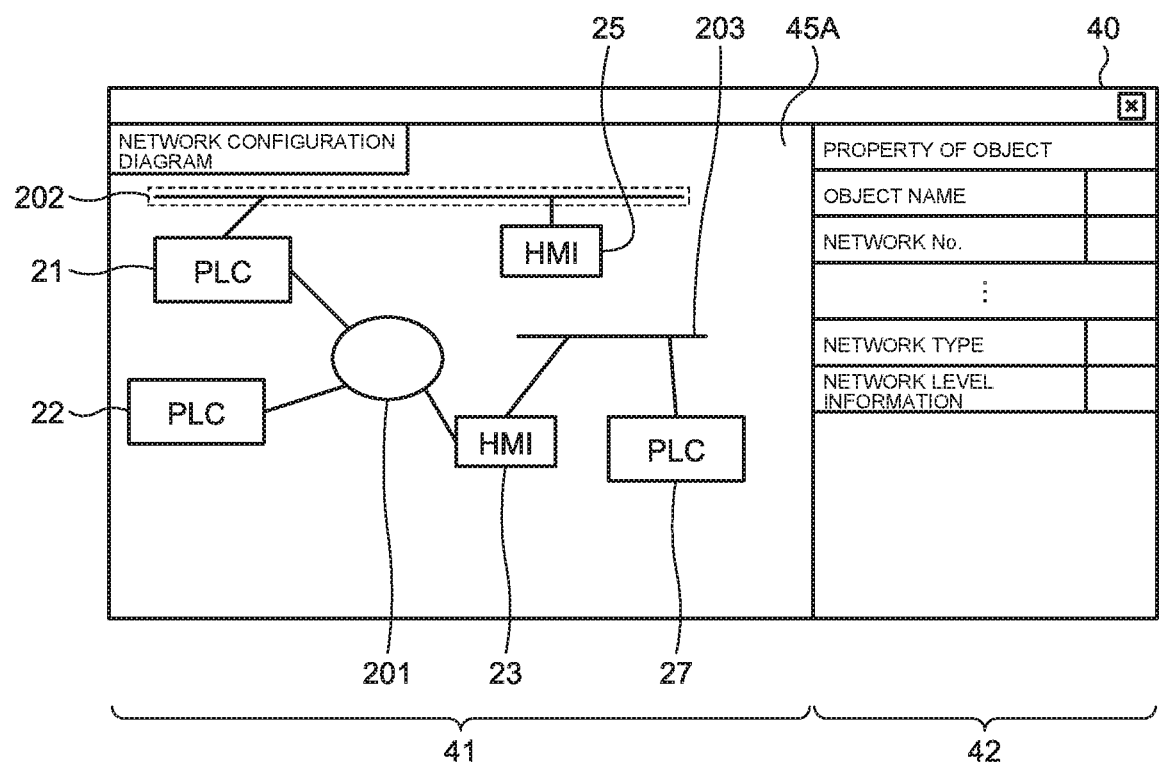
FIG. 3 is a diagram illustrating an example of a screen for creating a network configuration displayed by the system configuration creation supporting device according to the embodiment.

Next, an example of a screen for creating a network configuration by the system configuration creation supporting device 1 will be described. FIG. 3 is a diagram illustrating an example of a screen for creating a network configuration displayed by the system configuration creation supporting device according to the embodiment. In the description below, for convenience of explanation, an object corresponding to each component in a network system may be referred to by the names of its component. In other words, in the description of the network configuration diagram 45X, a device name, which is the name of the component, may be used instead of the object name.

FIG. 3 illustrates an example of the structure display region 40 that is a screen for creating a network configuration. A network configuration diagram 45A is an example of the network configuration diagram 45X. The network configuration diagram 45A includes networks 201, 202, and 203. The network configuration diagram 45A also includes PLCs 21, 22, and 27 and human machine interfaces (HMIs) 23 and 25, all of which are nodes. In this example, the networks 201 to 203 are objects of networks, the PLCs 21, 22, and 27 are objects of PLCs, and the HMIs 23 and 25 are objects of HMIs.

In addition, the two PLCs 21 and 22 and the HMI 23 are connected to the network 201. The PLC 21 and the HMI 25 are connected to the network 202, and the PLC 27 and the HMI 23 are connected to the network 203.

Property information on the network 201 is given network level information indicating that the network is at the highest level "1" and a network number "3" that is an identification number of the network 201.

Property information on the network 202 is given network level information indicating that the network is at the second highest level "2" and a network number "1" that is an identification number of the network 202.

Property information on the network 203 is given network level information indicating that the network is at the third highest level "3" and a network number "2" that is an identification number of the network 203.

In a case where the network configuration diagram 45A has a configuration as described above, the database accessing unit 51 stores the property information on each of the networks 201 to 203, the PLCs 21, 22, and 27, and the HMIs 23 and 25 in the property information storage area 92 of the database 30. The database accessing unit 51 stores, in the property information of the PLC 21, the network number "3" of the network 201 to which the PLC 21 is connected and the network number "1" of the network 202 to which the PLC 21 is connected.

When a user is to place a new object representing a network on the network configuration diagram 45A displayed on the display unit 20, the input unit 11 receives from the user a placement instruction to place the new object representing the network. The input unit 11 in receipt of the placement instruction sends the input placement instruction to the coordinate calculating unit 52. On the basis of the placement instruction, the coordinate calculating unit 52 displays, on the display unit 20, the object representing the new network. In this process, the coordinate calculating unit 52 gives a default value to network level information included in property information on the new network. The default value may be any value given by the coordinate calculating unit 52. In addition, the display unit 20 notifies the database accessing unit 51 that the object representing the new network is placed. The database accessing unit 51 thus registers, in the object list 91, the newly placed object representing the network, and registers the generated property information in the property information storage area 92.

In addition, when a user is to select an object representing a network on the network configuration diagram 45A displayed on the display unit 20, the input unit 11 receives from the user a specification instruction to specify the object representing the network. The specification instruction is an instruction to move a pointer to a position to specify the object that is to be selected on the structure display region 40. The input unit 11 sends the received specification instruction to the display unit 20 and the database accessing unit 51. The display unit 20 then displays the object representing the network in a manner different from the other objects in accordance with the specification instruction sent from the input unit 11. In addition, the database accessing unit 51 acquires the property information on the selected object from the database 30. The database accessing unit 51 then displays, on the property display region 12 of the display unit 20, the "network number", the "network level information", and other information, which are the property information on the selected object.

Figure 4:
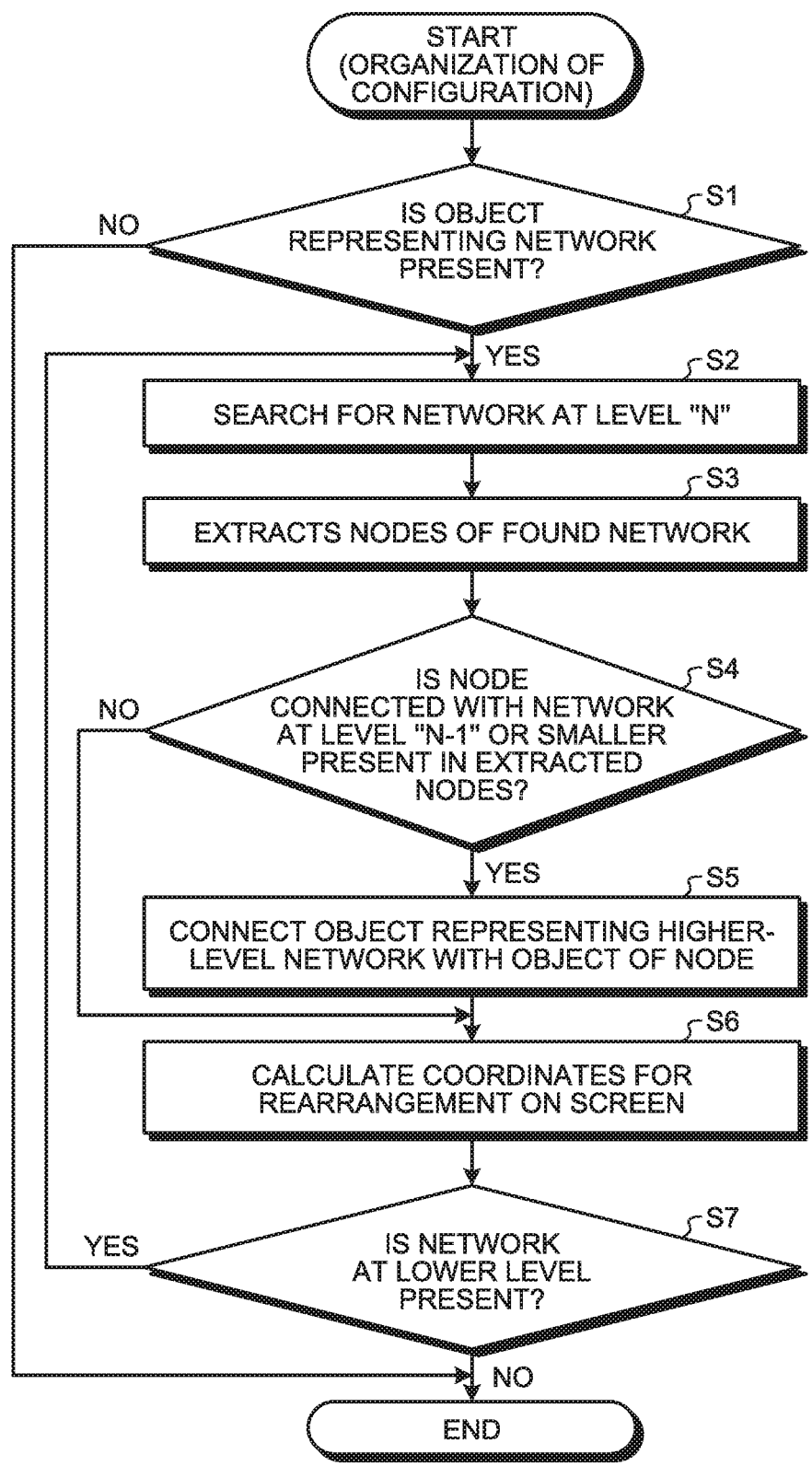
FIG. 4 is a flowchart illustrating the procedures of an organization process performed by the system configuration creation supporting device according to the embodiment.

Next, network configuration organizing procedures will be explained. FIG. 4 is a flowchart illustrating the procedures of an organization process performed by the system configuration creation supporting device according to the embodiment. Note that a case where the coordinate calculating unit 52 performs various processes on the basis of information in the database 30 will be explained below. For performing various processes on the basis of the information in the database 30, the coordinate calculating unit 52 acquires the information in the database 30 via the database accessing unit 51.

When a user refers to the display unit 20 and instructs execution of a function of organizing a network configuration and the input unit 11 receives the instruction, the coordinate calculating unit 52 of the system configuration creation supporting device 1 starts the network configuration organization process.

Thus, in step S1, the coordinate calculating unit 52 determines whether or not an object representing a network is present on the network configuration diagram 45A. When an object representing a network is present on the network configuration diagram 45A, that is, when the determination in step S1 is Yes, the coordinate calculating unit 52 searches for a network of a level "N" from the database 30 in step S2. The coordinate calculating unit 52 herein searches for a network having network level information indicating the level N−1, which is an initial value, that is, the level "1".

Thereafter, in step S3, the coordinate calculating unit 52 extracts nodes connected to the found network. In this process, the coordinate calculating unit 52 compares the network number of the found network with the network numbers of the nodes other than the network, and extracts from the database 30 nodes having the same network numbers as that of the found network. The coordinate calculating unit 52 then reads from the database 30 the property information on the found network and the property information on the extracted nodes.

In step S4, the coordinate calculating unit 52 further determines whether or not a node connected to a network of a level "N−1" or smaller is present in the extracted nodes. Specifically, the coordinate calculating unit 52 determines whether or not a node connected to a network of a higher level than the network of the level "N" is present in the extracted nodes.

When a node connected to a network of a level "N−1" or smaller is present in the extracted nodes, that is, when the determination in step S4 is Yes, the coordinate calculating unit 52 connects an object representing the network higher than the network of the level "N" to the extracted nodes in step S5. In other words, when a node connected to both of a higher-level network and a lower-level network is present, the coordinate calculating unit 52 connects the node to the higher-level network. Thus, when a node connected to a higher-level network and a lower-level network is present, the coordinate calculating unit 52 does not perform overlapping rearrangement, but connects the node to the higher-level network.

After step S5, the coordinate calculating unit 52 calculates coordinates of objects for rearrangement on the screen in step S6. Specifically, the coordinate calculating unit 52 gives each of objects a preset interval between the objects and calculates coordinates for rearranging the objects given the preset interval between the objects. In other words, the coordinate calculating unit 52 calculates coordinates of the individual objects so that the objects are arranged at the preset interval.

When no node connected to a network of a level "N−1" or smaller is present in the extracted nodes, that is, when the determination in step S4 is No, the coordinate calculating unit 52 calculates coordinates of nodes for rearrangement on the screen in step S6. Note that, when the extracted nodes are at the level "1", the coordinate calculating unit 52 determines that no node connected to a network at a level "N−1" or smaller is present in the extracted nodes. When the extracted nodes are at the level "1", which is N=1, the coordinate calculating unit 52 may omit the processes in steps S4 and S5.

After step S6, the coordinate calculating unit 52 determines whether or not a network of a lower level than the network of the level "N" is present in step S7. In other words, the coordinate calculating unit 52 determines whether or not a network of a level "N+1" is present. When the extracted nodes are at the level "1", the coordinate calculating unit 52 determines whether or not a network of the level "2" or lower is present. When the extracted nodes are at the level "2", the coordinate calculating unit 52 determines whether or not a network at the level "3" or lower is present.

When a network lower than the network of the level "N" is present, that is, when the determination in step S7 is Yes, the coordinate calculating unit 52 sets N=N−1 and repeats the processes in steps S2 to S6. The coordinate calculating unit 52 herein extracts a network having network level information indicating the level "2", which is a level N−2, and calculates coordinates for rearranging objects of extracted networks.

The coordinate calculating unit 52 repeats the processes in steps S2 to S7 until no network of a level lower than the network at the level "N" is present in the network configuration diagram 45A. In other words, by setting N=N+1 each time steps S2 to step S7 are performed, the coordinate calculating unit 52 increases N step-by-step, such that the processes in steps S2 to S7 are repeated until N becomes the maximum value. In other words, the coordinate calculating unit 52 repeats the processes in steps S2 to S7 until no object whose coordinates are to be calculated is present. As described above, the coordinate calculating unit 52 repeats the processes in steps S2 to S7 until the processes in steps S2 to S7 are performed on a network of the lowest one of a plurality of levels.

When no network lower than the network of the level "N" is present, that is, when the determination in step S7 is No, the coordinate calculating unit 52 terminates the network configuration organization process.

In addition, when no object representing a network is present in the network configuration diagram 45A, that is, when the determination in step S1 is No, the coordinate calculating unit 52 terminates the network configuration organization process.

Figure 5:
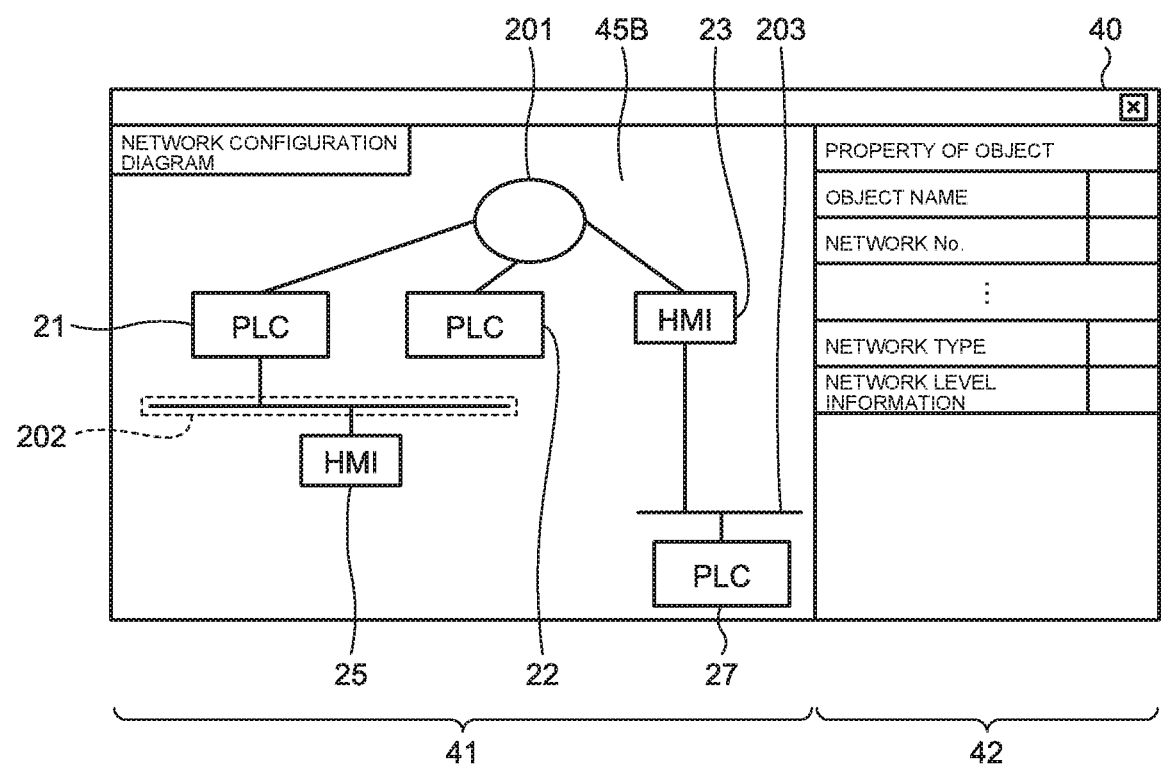
FIG. 5 is a diagram illustrating a first example of a network configuration diagram resulting from an organization process performed by the system configuration creation supporting device according to the embodiment.

FIG. 5 is a diagram illustrating a first example of the network configuration diagram resulting from the organization process performed by the system configuration creation supporting device according to the embodiment. A network configuration diagram 45B illustrated in FIG. 5 is a result of organization of the network configuration diagram 45A illustrated in FIG. 3. In other words, the coordinate calculating unit 52 creates the network configuration diagram 45B by rearranging the objects of the network configuration diagram 45A illustrated in FIG. 3, and displays the created network configuration diagram 45B on the display unit 20.

As illustrated in FIG. 5, in the network configuration diagram 453, the direction in which the network levels are arranged is the vertical direction from the top to the bottom.

Thus, the coordinate calculating unit 52 arranges the objects in order downward from the object on the first tier that is the uppermost tier.

When displaying the network configuration diagram 45B, the coordinate calculating unit 52 places the network 201 of the level "1" on the first tier in the vertical direction in the configuration diagram display region 41. The coordinate calculating unit 52 then places the objects connected to the network 201 under the network 201 in the configuration diagram display region 41. Specifically, the coordinate calculating unit 52 places the PLCs 21 and 22 and the HMI 23 on the second tier that is under the network 201.

In addition, when displaying the network configuration diagram 45B, the coordinate calculating unit 52 places the network 202 of the level "2" on the third tier that is under the PLCs 21 and 22 and the HMI 23 in the configuration diagram display region 41. The coordinate calculating unit 52 then places the objects connected to the network 202 under the network 202 in the configuration diagram display region 41. Specifically, the coordinate calculating unit 52 places the object indicating the HMI 25, on the fourth tier that is under the network 202.

In addition, when displaying the network configuration diagram 45B, the coordinate calculating unit 52 places the network 203 of the level "3" on the fifth tier that is under the HMI 25 in the configuration diagram display region 41. The coordinate calculating unit 52 then places the objects connected to the network 203 under the network 203 in the configuration diagram display region 41. Specifically, the coordinate calculating unit 52 places the object indicating the PLC 27 on the sixth tier that is under the network 203.

Note that the property information displayed in the property display region 42 is the same as that when the network configuration diagram 45A is displayed and that when the network configuration diagram 45B is displayed in the configuration diagram display region 41.

As described above, the coordinate calculating unit 52 rearranges the objects indicating the nodes connected to the network 201 after rearranging the network 201 located at the highest level. After completing rearrangement of the objects located on the first tier and the second tier, which are at the highest level, the coordinate calculating unit 52 then repeats the same processes on the objects located at the second highest level as the processes on the objects located at the highest level.

As described above, the system configuration creation supporting device 1 calculates the coordinates of the individual objects by using the network level information. As a result, the network configuration can be organized from a higher-level network toward a lower-level network.

Figure 6:
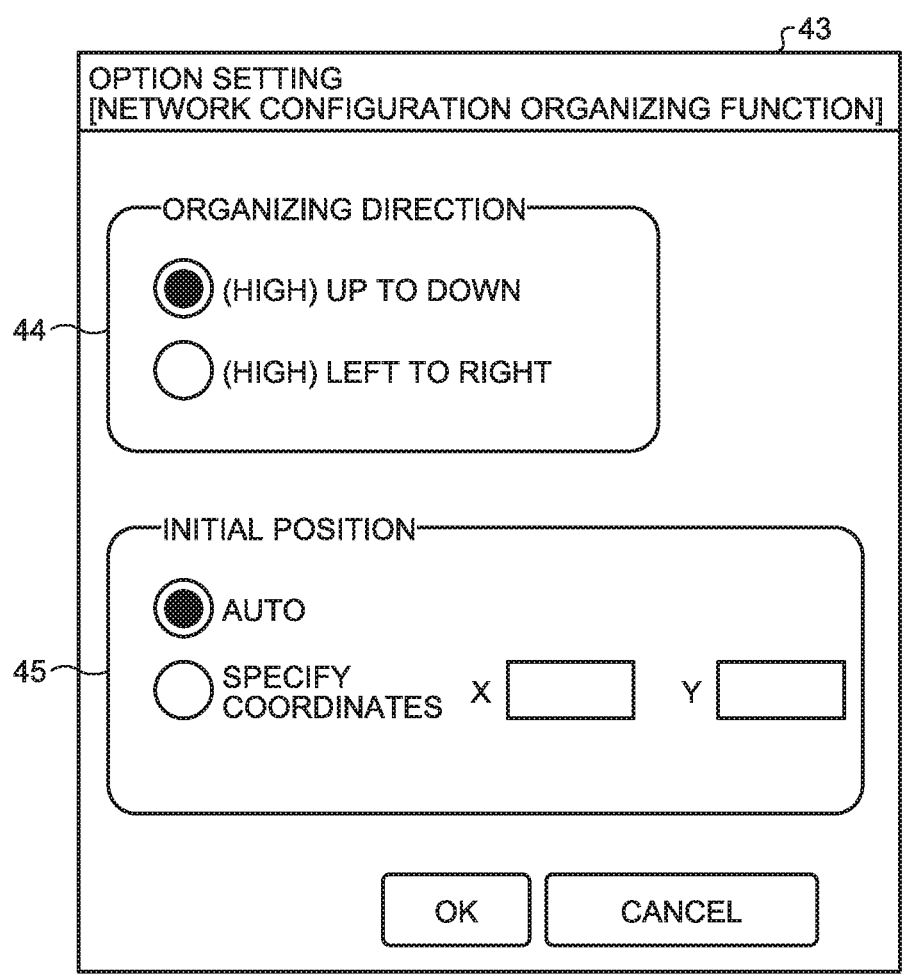
FIG. 6 is a diagram illustrating an example of display of an option setting display region according to the embodiment.

Next, option setting of screen display will be explained. FIG. 6 is a diagram illustrating an example of display of an option setting display region according to the embodiment. When performing option setting of a network configuration organizing function on the basis of an instruction from a user, the coordinate calculating unit 52 displays on the option setting display region 43 a screen for option setting.

Specifically, the coordinate calculating unit 52 displays a set item 44 of "organizing direction" and a set item 45 of "initial position" on the option setting display region 43. Using the set item 44 of "organizing direction", a user can select the direction in which the levels are displayed.

When the input unit 11 has received from a user an instruction to select the organizing direction "up to down" at the set item 44 of "organizing direction", the coordinate calculating unit 52 places a higher level at an upper location on the configuration diagram display region 41. Specifically, when the input unit 11 has received from a user an instruction to select the organizing direction "up to down", the coordinate calculating unit 52 displays on the display unit 20 the network configuration diagram 45B illustrated in FIG. 5.

Alternatively, when the input unit 11 has received from a user an instruction to select the organizing direction "left to right" at the set item 44 of "organizing direction", the coordinate calculating unit 52 places a higher level at a left location on the configuration diagram display region 41. Specifically, when the input unit 11 has received from a user an instruction to select the organizing direction "left to right", the coordinate calculating unit 52 displays on the display unit 20 the network configuration diagram 45C, which will be described later.

Figure 7:
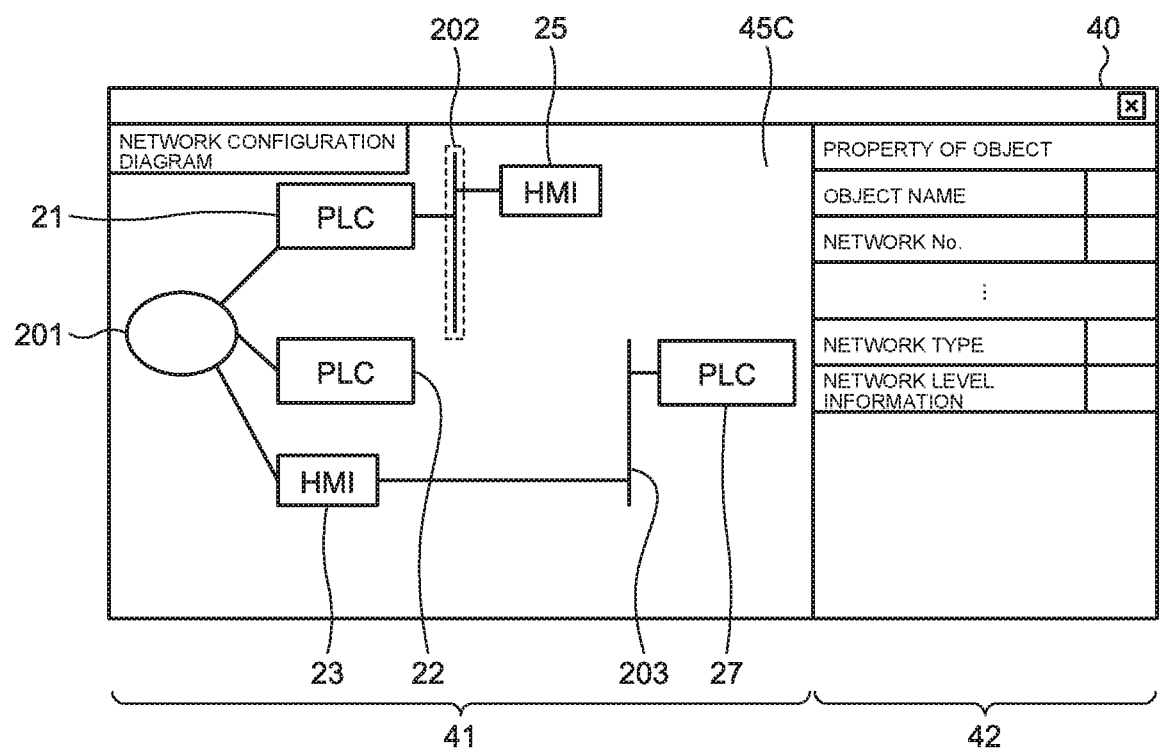
FIG. 7 is a diagram illustrating a second example of a network configuration diagram resulting from an organization process performed by the system configuration creation supporting device according to the embodiment.

FIG. 7 is a diagram illustrating a second example of the network configuration diagram resulting from the organization process performed by the system configuration creation supporting device according to the embodiment. The network configuration diagram 45C illustrated in FIG. 7 is a result of organization of the network configuration diagram 45A illustrated in FIG. 3. In other words, the coordinate calculating unit 52 creates the network configuration diagram 45C by rearranging the objects of the network configuration diagram 45A illustrated in FIG. 3, and displays the created network configuration diagram 45C on the display unit 20.

As illustrated in FIG. 7, in the network configuration diagram 45C, the direction in which the network levels are arranged is the horizontal direction from the left to the right. Thus, the coordinate calculating unit 52 arranges the objects in order rightward from the object on the first tier that is the leftmost tier.

When displaying the network configuration diagram 45C, the coordinate calculating unit 52 places the network 201 of the level "1" on the first tier in the horizontal direction in the configuration diagram display region 41. The coordinate calculating unit 52 then places the objects connected to the network 201 on the right side of the network 201 in the configuration diagram display region 41. Specifically, the coordinate calculating unit 52 places the PLCs 21 and 22 and the HMI 23 on the second tier that is on the right side of the network 201.

In addition, when displaying the network configuration diagram 45C, the coordinate calculating unit 52 places the network 202 of the level "2" on the third tier that is on the right side of the PLCs 21 and 22 and the HMI 23 in the configuration diagram display region 41. The coordinate calculating unit 52 then places the objects connected to the network 202 on the right side of the network 202 in the configuration diagram display region 41. Specifically, the coordinate calculating unit 52 places the object indicating the HMI 25 on the fourth tier that is on the right side of the network 202.

In addition, when displaying the network configuration diagram 45C, the coordinate calculating unit 52 places the network 203 of the level "3" on the fifth tier that is on the right side of the HMI 25 in the configuration diagram display region 41. The coordinate calculating unit 52 then places the objects connected to the network 203 on the right side of the network 203 in the configuration diagram display region 41. Specifically the coordinate calculating unit 52 places the object indicating the PLC 27 on the sixth tier that is on the right side of the network 203.

In organizing the network configuration diagram, the coordinate calculating unit 52 may change, as necessary, the orientations or the sizes of objects on the screen, as with the networks 202 and 203 illustrated in FIG. 7. In addition, when organizing objects, a user can select whether the coordinates of a reference point at which to start the organization is set automatically by the system configuration creation supporting device 1 or manually by the user.

When the input unit 11 has received from a user an instruction to select "auto" at the set item 45 of "initial position" illustrated in FIG. 6, the coordinate calculating unit 52 starts arrangement of the objects by using default coordinates. In contrast, when the input unit 11 has received from a user an instruction to select "specify coordinates" at the set item 45 of "initial position" illustrated in FIG. 6, the coordinate calculating unit 52 starts arrangement of the objects by using an X coordinate and a Y coordinate that are input by the user.

Figure 8:
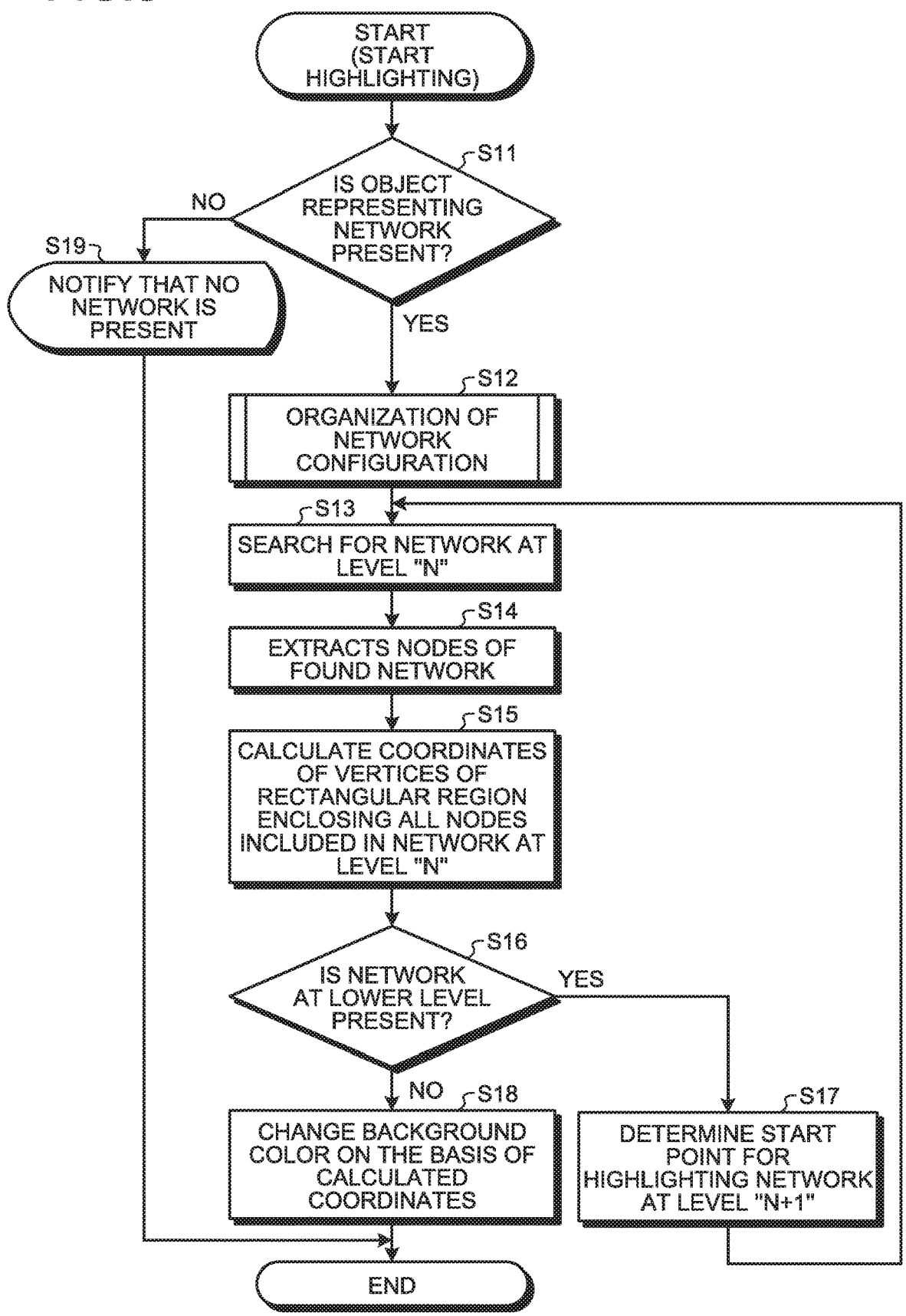
FIG. 8 is a flowchart illustrating the procedures of a highlighting process performed by the system configuration creation supporting device according to the embodiment.

Next, network configuration highlighting procedures will be explained. FIG. 8 is a flowchart illustrating the procedures of a highlighting process performed by the system configuration creation supporting device according to the embodiment. A description herein will be made as to a case where the coordinate calculating unit 52 highlights each of the levels of the network configuration of the network configuration diagram 45B. Note that explanation of processes similar to the processes in the network configuration organization process illustrated in FIG. 4 will be omitted.

When the display unit 20 has received from a user an instruction to perform the highlighting function, the coordinate calculating unit 52 of the system configuration creation supporting device 1 starts the network configuration highlighting process. Thus, in step S11, the coordinate calculating unit 52 of the system configuration creation supporting device 1 determines whether or not an object representing a network is present on network configuration diagram 45B.

When an object representing a network is present in the network configuration diagram 45B, that is, when the determination in step S11 is Yes, the coordinate calculating unit 52 performs the network configuration organization process in step S12. Specifically, the coordinate calculating unit 52 performs the network configuration organization process in accordance with the procedures explained with reference to FIG. 4.

Thereafter, in step S13, the coordinate calculating unit 52 searches for a network of a level "N". The coordinate calculating unit 52 herein searches for a network having network level information indicating the level "1".

Furthermore, in step S14, the coordinate calculating unit 52 extracts nodes connected to the found network. Then, in step S15, the coordinate calculating unit 52 calculates coordinates of vertices of a rectangular region enclosing all the nodes included in the network of the level "N". Specifically, the coordinate calculating unit 52 reads the property information on the found network and the property information on the extracted nodes from the database 30. The coordinate calculating unit 52 then extracts all the nodes included in the network of the level "N" on the basis of the read property information. The coordinate calculating unit 52 further calculates coordinates of the objects indicating all the nodes included in the network of the level "N". The coordinate calculating unit 52 also calculates a rectangular region enclosing all the nodes included in the network of the level "N", and calculates coordinates of vertices of the rectangular region. The coordinate calculating unit 52 may calculate the vertices of the rectangular region after providing margin regions for the objects rearranged when the network configuration organizing function was performed. In this case, the coordinate calculating unit 52 provides the margin regions around the rearranged coordinates by using a value for setting margins for each of the network types held in the system configuration creation supporting device 1, and calculates the coordinates of the vertices of the rectangular region including all the nodes and the margin regions.

The coordinate calculating unit 52 adds the element "organizing direction" in FIG. 6 to the rectangular region derived by the calculation for providing the margin, and then determines a start point of the rectangular region of a lower-level network.

After step S15, in step S16, the coordinate calculating unit 52 determines whether or not a network of a lower level than the network of the level "N" is present. In other words, the coordinate calculating unit 52 determines whether or not a network of a level "N+1" is present.

When a network of a lever lower than the network at the level "N" is present, that is, when the determination in step S16 is Yes, the coordinate calculating unit 52 determines a start point for highlighting the network of the level "N+1" in step S17. The coordinate calculating unit 52 then sets N=N+1, and then repeats the processes in steps S13 to S16. The coordinate calculating unit 52 herein extracts a network having network level information indicating the level "2", and calculates coordinates of vertices of a rectangular region enclosing all the nodes included in the extracted network.

The coordinate calculating unit 52 repeats the processes in steps S17 and S12 to S16 until no network of a level lower than the network of the level "N" is present. In other words, the coordinate calculating unit 52 repeats the processes in steps S17 and S12 to S16 until no network for which coordinates of vertices of a rectangular region are to be calculated is present. Specifically, by setting N=N+1 each time the processes in steps S17 and S12 to S16 are performed, the coordinate calculating unit 52 increases N step-by-step, such that the processes in steps S17 and S12 to S16 are repeated until N becomes the maximum value. As described above, the coordinate calculating unit 52 repeats the processes in steps S17 and S12 to S16 until the processes in steps S17 and S12 to S16 are performed on a network of the lowest one of a plurality of levels.

When no network lower than the network of the level "N" is present, that is, when the determination in step S16 is No, in step S18, the coordinate calculating unit 52 changes the background color of the rectangular region on the basis of the calculated coordinates. As described above, the coordinate calculating unit 52 highlights the background color of the network configuration diagram 453 on a network-level-by-network-level basis after completing the process of calculating coordinates for all the network levels.

In addition, when no object representing a network is present in the network configuration diagram 45B, that is, when the determination in step S11 is No, in step S19, the coordinate calculating unit 52 notifies the user of presence of no network by using the display unit 20. The coordinate calculating unit 52 displays on the display unit 20 a message indicating that no network is present to thereby notify the user of presence of no network. The coordinate calculating unit 52 then terminates the network configuration highlighting process.

Figure 9:
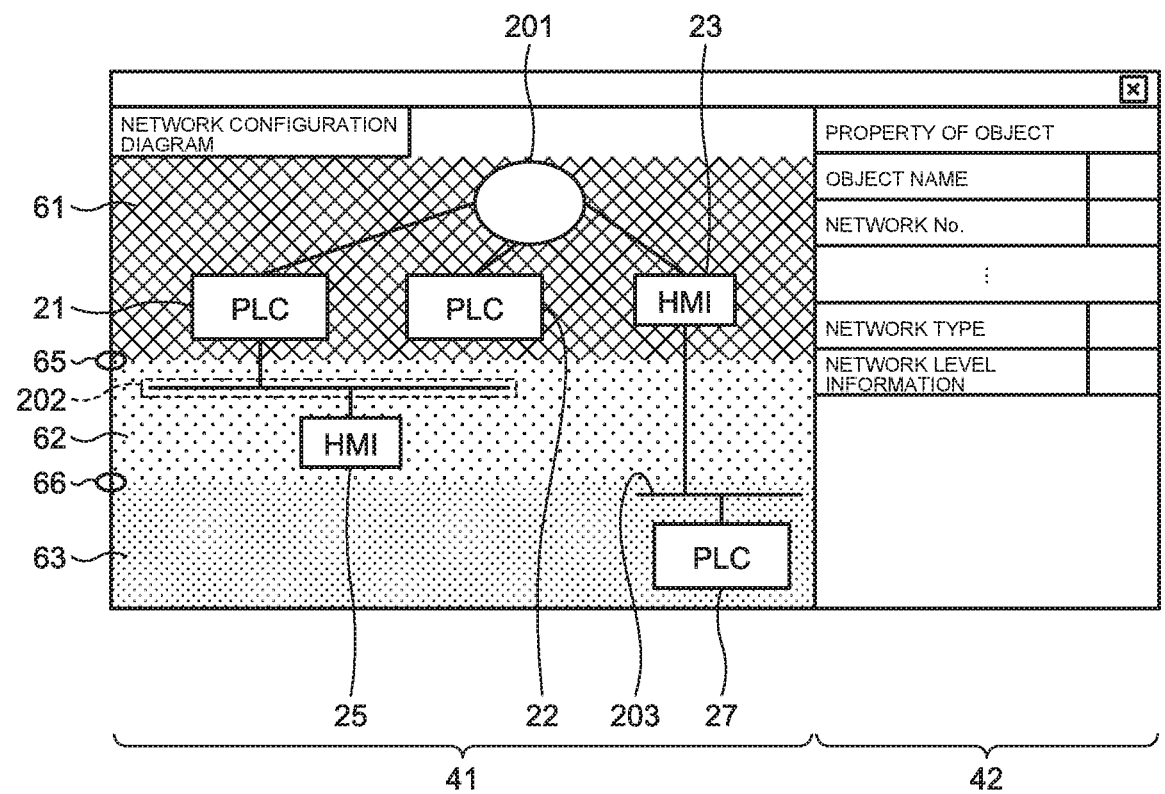
FIG. 9 is a diagram illustrating an example of display of highlighting performed by the system configuration creation supporting device.

FIG. 9 is a diagram illustrating an example of display of highlighting performed by the system configuration creation supporting device. A result of the process illustrated in FIG. 8 highlights network levels as illustrated in FIG. 9. When highlighting the network configuration diagram 45B, the coordinate calculating unit 52 performs the process illustrated in FIG. 8 to thereby calculate a rectangular region including all the nodes in a network of each network level.

The coordinate calculating unit 52 then highlights each rectangular region, which is a region of each network level.

The coordinate calculating unit 52 highlights in a first color a rectangular region 61 including the network 201 of the level "1" and the objects connected to the network 201. In other words, the coordinate calculating unit 52 sets the rectangular region 61 at the network level "1", and highlights the rectangular region 61 in the first color. The rectangular region 61 includes the objects on the first tier and the second tier in the vertical direction.

In addition, the coordinate calculating unit 52 highlights, in a second color, a rectangular region 62 including the network 202 of the level "2" and the objects connected to the network 202. In other words, the coordinate calculating unit 52 sets the rectangular region 62 at the network level "2" and highlights the rectangular region 62 in the second color. The rectangular region 62 includes the objects on the third tier and the fourth tier in the vertical direction.

Note that the coordinate calculating unit 52 regards vertex coordinates 65 at a lower left of the rectangular region 61, as a reference point of the rectangular region 62. The coordinate calculating unit 52 thus sets the vertex coordinates 65 as start coordinates of the rectangular region 62. As a result, the coordinate calculating unit 52 sets the vertex coordinates 65 as vertex coordinates at an upper left of the rectangular region 62, and then places the rectangular region 62 under the rectangular region 61.

In addition, the coordinate calculating unit 52 highlights, in a third color, a rectangular region 63 including the network 203 of the level "3" and the objects connected to the network 203. In other words, the coordinate calculating unit 52 sets the rectangular region 63 at the network level "3", and highlights the rectangular region 63 in the third color. The rectangular region 63 includes the objects on the fifth tier and the sixth tier in the vertical direction.

Note that the coordinate calculating unit 52 regards vertex coordinates 66 at a lower left of the rectangular region 62, as a reference point of the rectangular region 63. The coordinate calculating unit 52 thus sets the vertex coordinates 66 as start coordinates of the rectangular region 63. As a result, the coordinate calculating unit 52 sets the vertex coordinates 66 as vertex coordinates at an upper left of the rectangular region 63, and then places the rectangular region 63 under the rectangular region 62. Note that the coordinate calculating unit 52 may highlight each network level in the network configuration diagram 45C.

As described above, since the system configuration creation supporting device 1 rearranges objects on the basis of the network level information, a network configuration created in accordance with a user's instructions can be easily organized from a higher-level network toward a lower-level network. In addition, on the basis of the network level information, the system configuration creation supporting device 1 organizes objects by level, the networks can be displayed in different colors at different levels. As a result, the system configuration creation supporting device 1 is capable of displaying a network configuration diagram in such a manner that networks are clearly distinguished or discerned by level. These methods organize a complicated or obfuscated system configuration. In addition, networks are highlighted on a network-level-by-network-level basis, thereby improving the readability of a system configuration.

Note that the database accessing unit 51 may update information stored in the database 30 on the basis of information input to the display unit 20 by the input unit 11. In this case, the database accessing unit 51 may acquire from the input unit 11 information instructed to be modified, and update the information in the database 30 on the basis of the acquired information.

Figure 10:
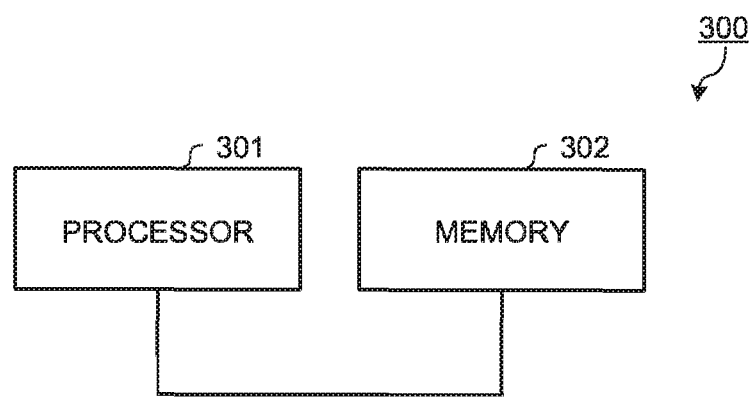
FIG. 10 is a diagram illustrating an example hardware configuration of a data processing unit according to the embodiment.

A hardware configuration of the data processing unit 10 described in the embodiment will now be described. FIG. 10 is a diagram illustrating an example hardware configuration of the data processing unit according to the embodiment. The data processing unit 10 may be implemented by a control circuit 300 illustrated in FIG. 10, that is, by a processor 301 and a memory 302. The processor 301 is a central processing unit (CPU; also referred to as a central processing device, a processing device, a computing device, a microprocessor, a microcomputer, a processor, or a DSP), a system large scale integration (LSI), or the like. The memory 302 is a nonvolatile or volatile semiconductor memory such as a random access memory (RAM), a read only memory (ROM), a flash memory, and an erasable programmable read only memory (EPROM, ally erasable programmable read only memory (EEPROM), a magnetic disk, a flexible disk, an optical disk, a compact disc, a mini disc, a digital versatile disc (DVD), or the like.

The data processing unit 10 is implemented by the processor 301 reading and executing programs stored in the memory 302 for operating as the data processing unit 10. In other words, the programs cause a computer to execute the procedures or methods of the database accessing unit 51 and the coordinate calculating unit 52. The memory 302 is also used as a temporary memory when the processor 301 executes various processes.

Thus, the programs that is to be executed by the processor 301 are a computer program product including a computer-readable and non-transitory recording medium containing a plurality of computer-executable instructions for performing data processing. The programs to be executed by the processor 301 include a plurality of instructions that cause a computer to perform data processing.

Alternatively, the data processing unit 10 may be implemented by dedicated hardware. A processing circuit that is dedicated hardware of the data processing unit 10 implements functions similar to the functions implemented by the processor 301 and the memory 302 illustrated in FIG. 10. In this case, the processing circuit is a single circuit, a composite circuit, a programmed processor, a parallel-programmed processor, an application specific integrated circuit (ASIC), a field programmable gate array (FPGA), or a combination thereof, for example. The functions of the respective components of the database accessing unit 51 and the coordinate calculating unit 52 may be each implemented by a processing circuit, or may be implemented collectively by a processing circuit. Note that some of the functions of the data processing unit 10 may be implemented by dedicated hardware, and others may be implemented by software or firmware.

As described above, according to the embodiment, the coordinate calculating unit 52 rearranges objects by level on the basis of the network level information 73 and 83 indicating the network levels. As a result, the network configuration diagram 45X can be reconstructed understandably and displayed. This clarifies hierarchical structures of networks in increasingly large-scale network systems. As a result, the efficiency of network design is improved and the visibility of networks is improved. In addition, when a node connected to a higher-level network and a lower-level network is present, the coordinate calculating unit 52 connects the node to the higher-level network, thereby enabling simple network configuration diagrams 45B and 45C to be created even in a case where connections of nodes are complicated. Thus, a configuration of a network system including a plurality of network levels can be easily created.

In addition, the data processing unit 10 compares the network number of a network with network numbers of objects other than the network, extract objects of the same network number as the network, and displays a network configuration on the display unit 20. As a result, the network configuration can be easily displayed on a level-by-level basis.

In addition, the data processing unit 10 displays on the display unit 20 an input screen for a user to set network level information. As a result, the network level information can be easily set.

In addition, on the basis of the network level information set by the user, the data processing unit 10 displays on the display unit 20 a network configuration diagram having objects rearranged thereon. As a result, the network configuration can be easily displayed by level even in a case where a network configuration diagram is edited.

In addition, the data processing unit 10 causes the display unit 20 to highlight a network configuration diagram by network level on the basis of the network level information. As a result, the readability of the system configuration is improved and verification and check of the system configuration is facilitated.

In addition, the data processing unit 10 causes the display unit 20 to display a list of property information on objects on the basis of network level information. As a result, a user can easily edit a network configuration diagram.

The configurations presented in the embodiment above are examples of the present invention, which can be combined with other known technologies or can be partly omitted or modified without departing from the scope of the present invention.

REFERENCE SIGNS LIST

1 system configuration creation supporting device; 10 data processing unit; 11 input unit; 20 display unit; 30 database; 40 structure display region; 41 configuration diagram display region; 4 property display region; 43 option setting display region; 45A to 45C, and 45X network configuration diagram; 51 database accessing unit; 52 coordinate calculating unit; 61 to 63 rectangular region; 70, 80 property information; 71, 81 object type; 72, 82-1, 82-2 network number; 73, 83 network level information; 201 to 203 network.

The invention claimed is:

1. A system configuration creation supporting device comprising:
a receiver to receive a first network number and first network level information given to a first object and receive a second network number given to a second object, the first object being an image representing each of networks in a network system defined by a plurality of network levels, the second object being an image representing a node connected to at least one of the networks;
a database to store the first network number and first network level information given to a first object and store the second network number given to the second object, the first network level information indicating to which level in a network configuration the first object belongs;
data processing circuitry to search the database for the first object of each of the network levels on a basis of the first network level information, compare the first network number of the found first object with the second network number of the second object, extract the second object connected to the first object, and calculate coordinates of each of the first object and the extracted second object in a network configuration diagram of the network configuration; and
a display to arrange the network levels in an order from a highest network level to a lowest network level, and display, as the network configuration diagram, a connection between the first object and the second object in each of the network levels on the basis of the coordinates of each of the objects.

2. The system configuration creation supporting device according to claim 1, wherein when either one or both of the first object and the second object are added to the network system, the data processing circuitry recalculates coordinates of each of the objects in each of the network levels on the basis of the network level information given to the added object, and rearranges the objects in the network configuration diagram.

3. The system configuration creation supporting device according to claim 1, wherein when a plurality of the network numbers are given to the extracted second object, the data processing circuitry displays the network configuration diagram such that the second object is connected to the first object of a higher network level.

4. The system configuration creation supporting device according to claim 1, wherein when arranging each of the objects, the data processing circuitry displays an input screen for a user to set the network level information on the display.

5. The system configuration creation supporting device according to claim 1, wherein the data processing circuitry calculates the coordinates of each of the objects such that the respective objects are arranged at a preset interval.

6. The system configuration creation supporting device according to claim 1, wherein on the basis of the network level information, the data processing circuitry causes the display to display the network configuration diagram with each of the network levels being distinguishably highlighted.

7. The system configuration creation supporting device according to claim 1, wherein the data processing circuitry displays a list of property information on each of the objects on the display on the basis of the network level information.

8. The system configuration creating supporting device according to claim 1, wherein the receiver is further configured to receive an indication of an organizing direction, and the display is further configured to arrange the network levels in order from the highest network level to the lowest network level based on the organizing direction.

9. The system configuration creating supporting device according to claim 8, wherein the indication of the organizing direction is one of a left-to-right organizing direction corresponding to arranging the network levels with the higher levels at a left side of the display and a top-to-bottom organizing direction corresponding to arranging the network levels with the higher levels at a top side of the display.

10. The system configuration creating supporting device according to claim 1, wherein the database is further configured to store a third network number given to the second object, when the second object is connected to more than one network.

11. The system configuration creating supporting device according to claim 10, wherein the second object is configured to be connected to a first network indicated by the second network number and the second object is configured to be connected to a second network indicated by the third network number.

12. The system configuration creating supporting device according to claim 1, wherein the node corresponding to the second object is one of a programmable logic controller and a control screen.

13. A method of operating a system configuration creation supporting device comprising:
 receiving a first network number and first network level information given to a first object and receive a second network number given to a second object, the first object being an image representing each of networks in a network system defined by a plurality of network levels, the second object being an image representing a node connected to at least one of the networks;
 storing, in a database, the first network number and first network level information given to a first object and store the second network number given to the second object, the first network level information indicating to which level in a network configuration the first object belongs;
 searching the database, using data processing circuitry, for the first object of each of the network levels on a basis of the first network level information;
 comparing the first network number of the found first object with the second network number of the second object;
 extracting the second object connected to the first object;
 calculating coordinates of each of the first object and the extracted second object in a network configuration diagram of the network configuration;
 arranging the network levels in an order from a highest network level to a lowest network level; and
 displaying, as the network configuration diagram, a connection between the first object and the second object in each of the network levels on the basis of the coordinates of each of the objects.

* * * * *